United States Patent [19]

Abernathey et al.

[11] Patent Number: 4,649,627

[45] Date of Patent: Mar. 17, 1987

[54] METHOD OF FABRICATING SILICON-ON-INSULATOR TRANSISTORS WITH A SHARED ELEMENT

[75] Inventors: John R. Abernathey, Jericho, Vt.; Wayne I. Kinney, Albuquerque, N. Mex.; Jerome B. Lasky, Essex Junction; Scott R. Stiffler, Hinesburg, both of Vt.

[73] Assignee: International Business Machines Corporation, Armonk, N.Y.

[21] Appl. No.: 625,758

[22] Filed: Jun. 28, 1984

[51] Int. Cl.[4] ............................................ H01L 29/78
[52] U.S. Cl. .................................... 29/571; 29/576 E; 29/580; 148/DIG. 164; 148/DIG. 150; 148/DIG. 135
[58] Field of Search ...................... 29/576 E, 571, 580; 357/68, 23.7, 81; 148/DIG. 135, DIG. 164, 175, DIG. 150

[56] References Cited

U.S. PATENT DOCUMENTS

| | | | |
|---|---|---|---|
| 3,332,137 | 6/1967 | Kenney | 29/576 R |
| 3,595,719 | 7/1971 | Pomerantz | 156/17 |
| 3,647,581 | 3/1972 | Mash | 148/175 |
| 3,721,593 | 3/1973 | Hays et al. | 156/17 |
| 3,959,045 | 5/1976 | Antypas | 156/3 |
| 3,974,515 | 8/1976 | Ipri et al. | 357/23 |
| 4,118,857 | 10/1978 | Wong | 29/574 |

OTHER PUBLICATIONS

"Fusion of Silicon Wafers", IBM Technical Disclosure Bulletin, vol. 19, No. 9, Feb., 1977, G. E. Brock, D. DeWitt, W. A. Pliskin & J. Riseman, pp. 3405-3406.
Kimura et al., "Epitaxial Jem Transfer Technique" Appl. Phys. Lett 43(3), Aug. 1, 1983, pp. 263-265.
Lam, "Silicon on Insulating Substrates" Internatn. Electron Devices Meeting, Dec. 1983, pp. 348-351.
Jastrzebski, "Comparison of Different SOI Tech", RCA Review, vol. 44, Jun. 1983, pp. 251-269.
Douglas, "The Route to 3-D Drops", High Technology, Sep. 1, 1983, pp. 55-59.

Primary Examiner—Brian E. Hearn
Assistant Examiner—Tuan Quach
Attorney, Agent, or Firm—Sughrue, Mion, Zinn, Macpeak and Seas

[57] ABSTRACT

A method of fabricating a shared element semiconductor structure in which the insulating layer of a silicon-on-insulator structure is patterned to form a gate oxide. The bulk semiconductor underlying the insulating layer is defined into an FET (field-effect transistor) with its gate region below the gate oxide. The epitaxial layer above the insulating layer is defined into another FET with its drain region above the gate oxide, whereby the drain region also operates as the gate electrode for the bulk FET. Also described is a method of forming a silicon on insulator substrate with insulating layer usable as a gate oxide by means of bonding a silicon substrate to an oxidized epitaxial layer on another silicon seed substrate and then removing the seed substrate.

8 Claims, 15 Drawing Figures

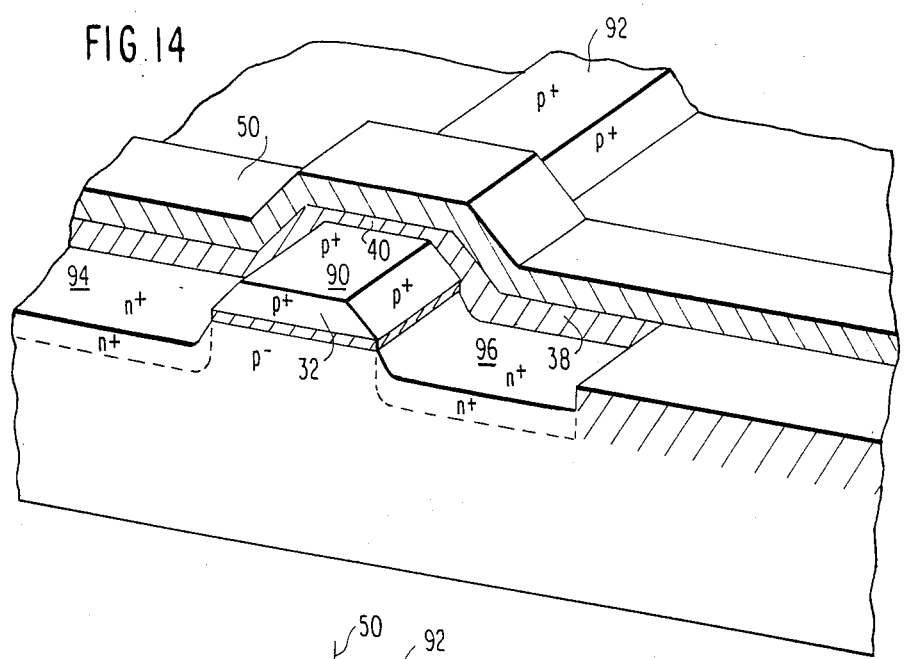
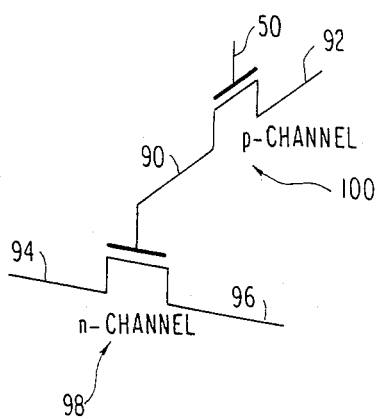

METHOD OF FABRICATING SILICON-ON-INSULATOR TRANSISTORS WITH A SHARED ELEMENT

DESCRIPTION

1. Field of the Invention

This invention relates generally to integrated circuits. In particular, it relates to transistors with a common shared element using silicon-on-insulator technology.

2. Background of the Invention

The worth of an integrated circuit technology must be judged in light of its density and its speed. The more densely the semiconductor elements are packed on the chip, the more complex the integrated circuit can be for a given chip area. Alternatively, a high density allows a smaller chip area for a given circuit, thus increasing yield and reducing cost. The higher the speed of the integrated circuit, the more computational power or thoughput can be achieved with the integrated circuit.

The density of elements on an integrated circuit chip depends on a number of factors. Most obviously, the smaller the area of a single element, the higher the density. However, it is sometimes possible to provide a vertical or layered structure to parts of the chip so that two separate elements can be occupying the same surface area. Another consideration is that the individual elements must be electrically connected, usually by metal or polysilicon lines. These interconnects require surface area so that a design which minimizes the interconnections provides a higher chip density.

One of the limiting factors or speed is the parasitic capacitance between the elements and between the individual elements and the substrate. One method of avoiding the substrate capacitance is to define the active elements in a thin semiconductor layer resting on top of an insulator. An example of this approach is silicon-on-sapphire (SOS). It has however been difficult to develop practical SOS processing technology. A more fundamental problem with SOS is that all the device definition must be performed within the thin layer of semiconductor. This limitation makes it difficult to provide a vertical structure in SOS. As a result, SOS has been used primarily as a planar technology and, as a result, has not achieved a desirably high device density.

SUMMARY OF THE INVENTION

Accordingly, it is an object of this invention to provide a dense integrated circuit.

It is a further object of this invention to provide an integrated circuit device with vertical layers of elements.

Yet a further object of this device is to provide an integrated circuit technology that reduces the number of interconnects.

The invention can be summarized as the integrated circuit and the method of fabricating it in which two field-effect transistors (FETs) are built according to silicon-on-insulator (SOI) technology with a shared element between them. The shared element is simultaneously acting as the source or drain of an FET built in the epitaxial SOI layer and is also acting as the gate electrode of another FET built in the bulk semiconductor.

This structure is accomplished by preparing an SOI substrate composed of an epitaxial surface layer, separated from a semiconductor bulk region by a thin insulating layer. An FET is defined in the epitaxial layer and another FET is transversely defined in the bulk with the epitaxial FET drain overlying the bulk FET gate region.

BRIEF DESCRIPTION OF THE DRAWINGS

FIGS. 12 and 13 are illustrations of SOI substrates of this invention usable for CMOS devices.

FIG. 14 is a CMOS shared element structure.

FIG. 15 is an equivalent circuit to FIG. 14.

DETAILED DESCRIPTION OF THE PREFERRED EMBODIMENTS

The invention uses an SOI (silicon on insulator) wafer to produce electronic devices in which a common or shared element is used as a source or drain on one FET (field effect transistor) and as a gate electrode on another FET.

In conventional semiconductor fabrication, the starting wafer is a bulk semiconductor. Subsequent processing provides for deposition of additional semiconductor layers and the doping of the original layers or the added layers. Device definition is provided by photolithography and sometimes by insulating oxide layers. Typically, conventional processing does not allow for the deposition of additional active semiconductor layers above oxide layers. However, SOI technology does allow for active semiconductor layers to be deposited on top of a formed oxide layer.

The conceptually simplest SOI technology fabricates the complete semiconductor device above the oxide so that the oxide acts as an insulating barrier between the device and the substrate. In effect, complete electronic devices are formed independent of the original semiconductor substrate. This process reduces capacitive coupling to the substrate and parasitic capacitance between separate devices.

The present invention, however, uses the insulating layer of the SOI structure in a different way. Specifically, the SOI insulating layer is patterned to form a gate oxide for a FET in the bulk substrate that has its channel or gate region beneath the gate oxide. The semiconductor deposited above the gate oxide is an integral part of another active device, such as a drain region for a FET formed completely above the insulating SOI region. Thus, the two FETs have a common or shared element, the drain/gate. This shared element design allows much denser integrated circuits both because the same area is being used for two purposes and because no interconnects are required between the two components having the shared element. Also as a result, high operational speeds are possible.

Figure 1:
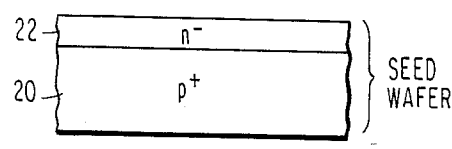
FIG. 1 is an illustration of a seed wafer.

The process for preparing the SOI substrate will now be described. A seed wafer, illustrated in cross section in FIG. 1, is prepared from a heavily doped p wafer 20 of silicon having a (100) face. An epitaxial layer 22 is grown on top of the p$^+$ wafer 20. Its thickness is in the range 0.1–4 μm, but 0.2–0.3 μm is a typical value. The epitaxial layer 22 is grown lightly doped and preferably of the opposite conductivity type of the wafer 20. The doping type and doping concentration of the epitaxial layer 22 is determined by the device to be fabricated so that it may be either $p^-$ or $n^-$ doping. Although it is possible that the wafer 20 may be of any doping type as long as it is heavily concentrated, it has been shown that a $n^+/p^-$ or a $p^+/n^-$ transition region provides superior etch stop characteristics for the hydrofluoric-nitric-acetic (HNA) etch to be described later. Thus it is preferable that the wafer 20 and the epitaxial layer 22 be of opposite conductivity types. Of these two combinations, $p^+/n^-$ is preferable because HNA shows an etch ratio of 2000:1 for etching $p^+$ faster than $n^-$. The corresponding ratio for $n^+/p^-$ is only 200:1. The doping concentration for $n^+$ or $p^+$ should be greater than $6 \times 10^{18}/cm^3$, although $1 \times 10^{19}/cm^3$ is typically used. The doping concentration for $n^-$ or $p^-$ should be less than $1 \times 10^{18}/cm$, although $10^{16}/cm^3$ is the range for typical devices.

Figure 2:
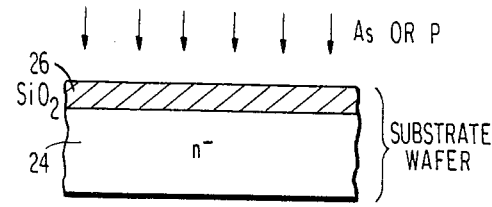
FIG. 2 is an illustration of a substrate wafer.

A substrate wafer, illustrated in FIG. 2, is made by thermally oxidizing a side of a $n^-$ wafer 24 to form an SOI insulating layer 26 of $SiO_2$. A (100) face on the wafer 24 provides a good interface to $SiO_2$ and good anistropic etch characteristics. Alternatively, the epitaxial layer 22 of the seed wafer could be oxidized to form the insulating layer 26 thereupon. Or, in yet a third method, both the seed and substrate wafers could be oxidized. The oxide should be thin, about 25 nm. Current technology has a lower limit of about 15 nm for gate oxides. An ion implantation with arsenic or phosphorous is performed upon the substrate wafer in order to tailor the threshold voltage for the $n^-$ wafer 24. The ion implantation can be performed through the insulating layer 26 if the substrate wafer has been oxidized.

Figure 3:
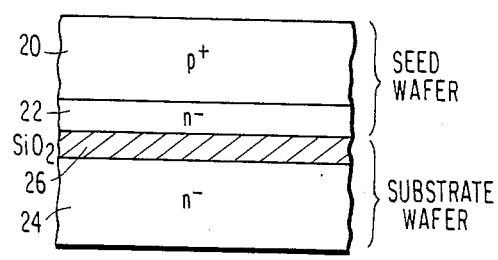
FIG. 3 is an illustration of the seed and substrate wafers bonded together.

The seed wafer and the substrate wafer are then placed on top of one another, as illustrated in FIG. 3, so that the epitaxial layer 22 is contacting the insulating layer 26. Which of the seed and substrate wafers is on top is immaterial. The seed wafer and the substrate wafer are then bonded by annealing the contacting wafers in an oxidizing atmosphere of either wet or dry oxygen at a temperature greater than approximately 700° C. Bonding at 1000° C. in steam for 20 minutes has been demonstrated. Thereafter, the seed and substrate wafers form a tightly bound pair. Alternative bonding techniques are described by Wallis in a technical article entitled "Field Assisted Glass Sealing" appearing in Electrocomponent Science and Technology, volume 2, No. 1, pp. 45-53 and by Kimura et al in a technical article entitled "Epitaxial Film Transfer Technique for Producing Single Crystal Si Film on an Insulating Substrate" appearing in Applied Physics Letters, volume 43, No. 3, 1983 at pp. 263-265. However these methods require either a thick oxide or mobile ions in the oxide, both inconsistent with a thin gate oxide. Additional references for bonding two semiconductor wafers are U.S. Pat. No. 3,332,137 to Kenney, U.S. Pat. No. 3,959,045 to Antypas and Japanese Patent document No. 58-9334.

Figure 4:
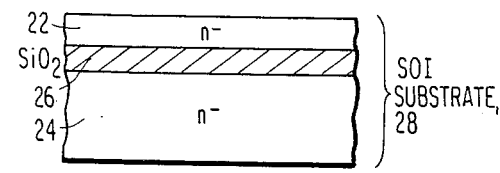
FIG. 4 is an illustration of an SOI substrate of this invention.

The $p^+$ region 20 of the bonded pair is now superfluous. Its primary use was for the formation and support of the epitaxial layer 22. The excess $p^+$ region is removed by one of a variety of methods. For example, it can be mechanically removed by grinding and/or chemical polishing followed by an etching in hydrofluoric-nitric-acetic (HNA) etching solution. Alternatively, the entire $p^+$ region can be etched away in HNA. The use of HNA is discussed by Muraoka et al. in a chapter entitled "Controlled Preferential Etching Technology" appearing in the book "Semiconductor Silicon 1973". (Electrochemical Society, Princeton, NJ, eds. Huff and Burgess) at page 326. With the excess $p^+$ region 20 removed, there is left an SOI substrate 28, illustrated in FIG. 4, comprising a $n^-$ epitaxial layer 22 and a $n^-$ bulk region 24 separated by the insulating layer 26. This completes the processing of the SOI substrate 28. It is noted that the HNA will not appreciably etch the lightly doped bulk region 24.

Figure 5:
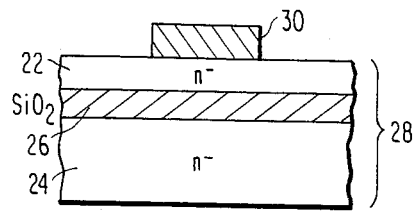
FIGS. 5–10 are illustrations of steps of the present invention with FIG. 10 being a PMOS shared element structure.

Processing for the fabrication of the shared element begins with the SOI substrate 28. A masking material is deposited or grown on the epitaxial layer 22. The masking material acts as an oxidation barrier and may be, for example, $Si_3N_4$. The masking material is patterned by known lithographic methods to form an oxidation mask 30, as illustrated in FIG. 5. The oxidation mask 30 defines the portions of the epitaxial layer 22 which will not be removed in the device fabrication.

Figure 6:
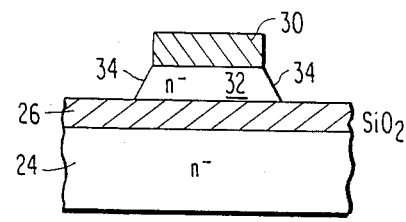

The SOI substrate 28 is patterned by using an anisotropic etch such as KOH or ethylene diamine pyrocatacol which removes the exposed epitaxial layer 22 to leave a defined upper region 32, shown in FIG. 6. Because of the anisotropic etch, side walls 34 of the defined region have exposed (111) surfaces at an angle of 54.7° to the surface. A dopant is implanted or diffused into the side walls 34 in order to keep the side walls in an off condition during operation, that is, to adjust the threshold voltage. A mask may be used to shield the bulk region 24 from the implantation if desired.

Figure 7:
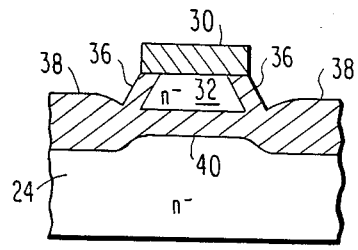
Figure 8:
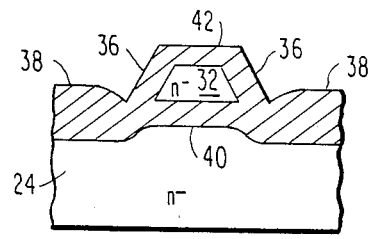

Then another oxidation is performed to grow, as illustrated in FIG. 7, a thick side wall oxide 36 thicker than 100 nm on the sloping side walls 34 of the defined upper region 32 as well as a thick field oxide 38 in the regions not covered by the oxidation mask 30. What is left of the insulating layer 26 of FIG. 6 becomes a defined thin lower gate oxide 40 beneath the defined upper region 32 and separating it from the bulk region 24. Then the oxidation mask 30 is removed by a wet etch in hot phosphoric acid or by plasma etching. An ion implantation is performed to adjust the threshold for devices built on top of the defined upper region 32. Then yet another oxidation is performed to deposit an upper gate oxide 42 of about 25 nm thickness above the defined upper region 32, as shown in FIG. 8. Although this oxidation is only important for the defined upper region 32, it may be performed without a mask because the minimal additional oxidation upon the oxide side walls 36 and the field oxide 38 is not important.

Figure 9:
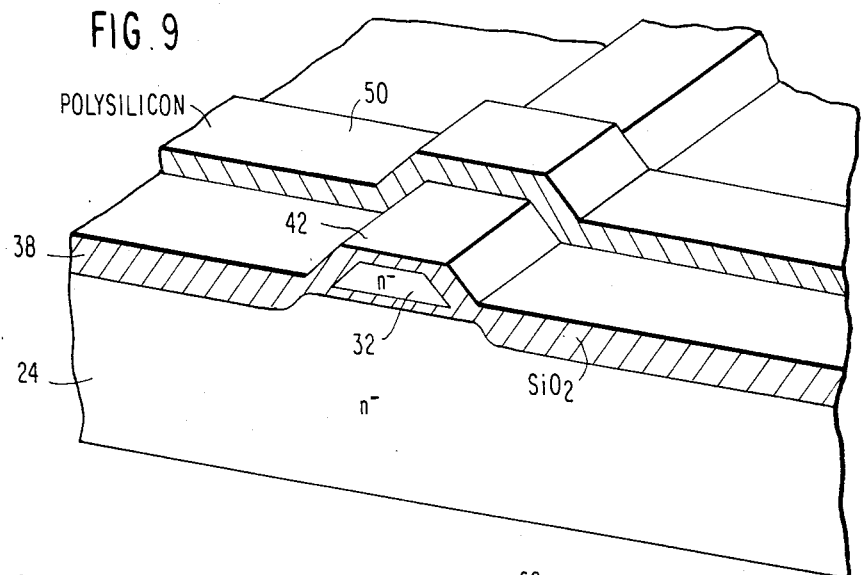

Polysilicon is then deposited over the top of the structure illustrated in FIG. 8 and is patterned to form a stripe 50 passing transversely over the defined upper region 32, as illustrated in FIG. 9. A silicide is another likely material for the stripe 50 and use of a metal is possible. Of course, the upper gate oxide 42 separates the polysilicon from the defined upper region 32. At this point, the three-dimensional structure begins to become apparent. The polysilicon stripe 50 forms a self-aligned gate with the defined upper region 32 over which it passes.

At this point, however, the processing steps for PMOS and CMOS fabrication significantly diverge. The PMOS steps will be described first.

Figure 10:
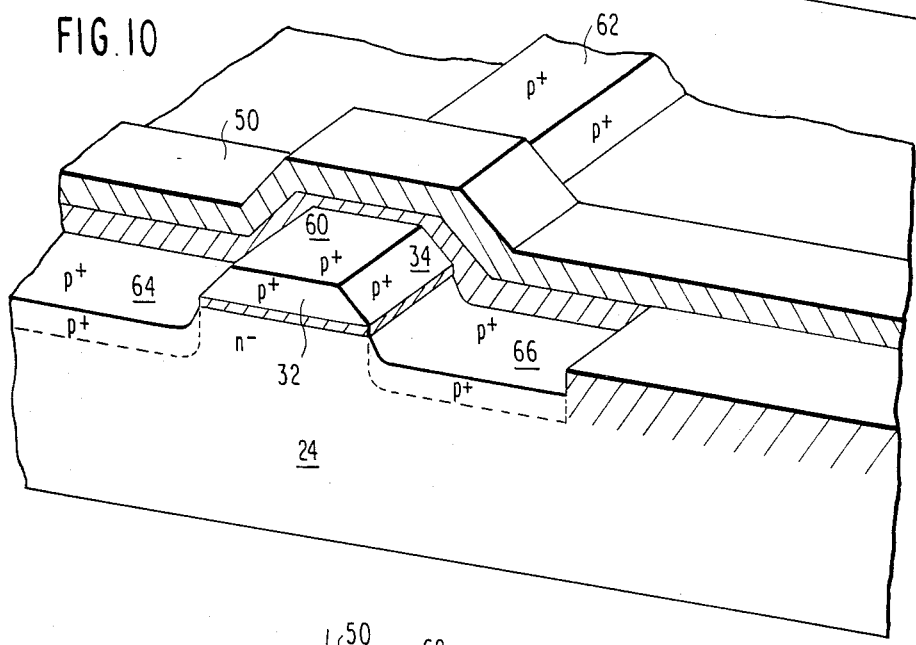

For PMOS processing, a lithographic mask is applied so that the silicon oxide layers 36, 38 and 42 in FIG. 8 are removed from the unmasked region. The silicon oxide is removed, as illustrated in FIG. 10, from an SOI source region 62 and a SOI drain region 60 on top of the defined upper region 32. It is to be understood for purposes of fabrication that the source region 62 and drain region 60 are equivalent and can be interchanged. The silicon oxide should also be removed from the side walls 34 and from a bulk source region 64 and a bulk drain region 66 on either side of the SOI drain region 60. An ion implantation is then performed to form p+ sources and drains in the unmasked areas of both the SOI layer 32 and the bulk region 20. The use of an anisotropic etch in creating the defined upper region 32 produced the sloping side walls 34 which can be easily implanted and covered with oxide. At this point, the regions 60, 64 and 66 are oxidized.

Figure 11:
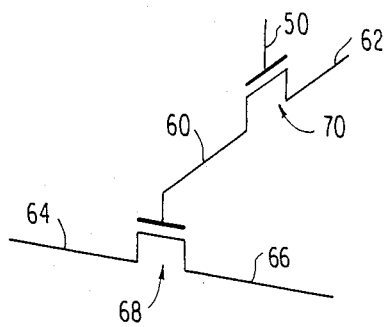
FIG. 11 is an equivalent circuit of FIG. 10.

The structure illustrated in FIG. 10 is electrically equivalent to the circuit shown in FIG. 11 which consists of two PMOS transistors 68 and 70. The transistor 68 is a bulk transistor and consists of a source of the bulk source region 64 and a drain of the bulk drain region 66. The gate electrode of the bulk transistor 68 is the SOI drain region 60 which is the shared element. The SOI transistor 70 includes a source which is the SOI source region 62 and a drain which is the SOI drain region 60. The gate electrode for the SOI transistor is the polysilicon stripe 50 overlying the defined upper region 32. Thus it is seen that the SOI drain region 60 serves as the shared element and operates as the gate electrode for the bulk transistor 68 and as the drain for the SOI or epitaxial transistor 70. It is to be appreciated that while the equivalent circuit of FIG. 11 illustrates that the gate electrode for the bulk transistor 68 is separated from the drain of the SOI transistor 70, in fact as illustrated in FIG. 10, there is no physical separation between these two elements and they are formed of the same SOI drain region 60.

Contacts are required to be made to the bulk source region 64 and to the bulk drain region 66. If desired, a contact can also be made to the SOI drain region 60, although it is not required for the circuit illustrated in FIG. 11. A further contact can be made to the SOI source region 62 but is not required if it is also being used as a shared element with another bulk transistor underlying it. The contacts are applied through the previously applied oxide in order to prevent the bulk source or drain region 64 or 66 from shorting the SOI drain region 60.

The preceding description of PMOS processing can obviously be modified for NMOS processing. A NMOS device would require that the epitaxial layer 22 of the seed wafer have p− doping and that the bulk region 24 of the substrate wafer likewise have p− doping. The remaining variations necessarily follow from these changes in conductivity types.

The initial steps for CMOS processing closely follow the steps for PMOS processing. However, the epitaxial layer 22 of the seed wafer and the bulk region 24 of the substrate wafer, illustrated in FIGS. 1 and 2, are chosen to have opposite conductivity types. This can be accomplished by choosing a p− epitaxial layer in the seed wafer which results in a p− epitaxial layer 82 in a CMOS SOI substrate 84, illustrated in FIG. 12. Alternatively, the bulk layer of the substrate wafer is made to be of p− doping which results in an p− bulk region 86 forming a CMOS SOI substrate 88, illustrated in FIG. 13. The CMOS SOI substrate 84, illustrated in FIG. 12, produces CMOS transistors in which the n-channel transistors are in the surface layer while the p-channel transistors are in the bulk. Of course, the situation is reversed for the SOI substrate 88 of FIG. 13.

For sake of example and to provide the preferred p+/n− interface for the HNA etch-back, the SOI substrate 84 will be chosen in the description of CMOS processing. The CMOS processing proceeds similarly through the PMOS steps up through the steps discussed in connection with FIG. 9. After the polysilicon stripe 50 has been formed, the substrate is masked around an SOI drain region 90 and an SOI source region 92 on top of the defined upper region 32, as illustrated in FIG. 14. An ion implantation is then performed to make the SOI drain region 90 and the SOI source region 92 p+-type. This ion implantation can be performed through the upper gate oxide 42 overlying the SOI source and drain regions 90 and 92 or the overlying oxide may be removed before the implant. Then another masking step is performed to leave open a bulk source region 94 and a bulk drain region 96. The thick oxide 38 is removed in these areas and another ion implantation is performed to turn these bulk source and drain regions 94 and 96 into n+-type. Finally, an activation anneal is performed to produce the CMOS circuit consisting of an p-channel SOI transistor between the SOI source and drain regions 90 and 90 and a bulk n-channel transistor between the bulk source and drain regions 94 and 96. An equivalent circuit for the structure of FIG. 14 is shown in FIG. 15. A buried bulk n-channel transistor 98 has its gate 90 as a common element with the drain 90 of a SOI p-channel transistor 100. Of course, the source and drain of either transistor 98 or 100 can be reversed.

We claim:

1. A method of fabricating a semiconductor structure, comprising the steps of:
    depositing an epitaxial semiconductor layer on a first side of a first semiconductor substrate;
    forming a silicon oxide layer of predetermined thickness on said epitaxial layer;
    bonding said first side of said substrate to a second semiconductor substrate using said silicon oxide layer as a bonding material, thereby forming a bonded structure;
    removing said first substrate from said bonded structure to expose a major surface of said epitaxial layer;
    removing said epitaxial layer in selected areas to form active device regions of said epitaxial layer;
    forming a field oxide on areas of said epitaxial layer other than said active device regions;
    forming a gate oxide on areas of said epitaxial layer over said active device regions;
    forming a conductive gate electrode over a predetermined portion of said gate oxide;
    defining and forming SOI source and drain regions in said epitaxial layer on either side of said gate electrode, said SOI regions having a conductivity type the opposite of said epitaxial layer; and
    defining and forming bulk source and drain regions in portions of said second substrate on either side of at least one of said SOI source and drain regions, said bulk regions having a conductivity type opposite the conductivity type of said second substrate.

2. A method of fabricating a semiconductor structure as recited in claim 1, wherein said epitaxial layer and said second substrate have the same conductivity type.

3. A method of fabricating a CMOS semiconductor structure as recited in claim 1, wherein said epitaxial layer and said second substrate have opposite conductivity types.

4. A method of fabricating a semiconductor structure as recited in claim 1, further comprising the steps of:
removing said epitaxial layer in selected areas to form active device regions of said epitaxial layer;
forming a field oxide on areas of said epitaxial layer other than said active device regions;
forming a conductive gate electrode over a predetermined portion of said gate oxide;
defining and forming SOI source and drain regions in said epitaxial layer on either side of said gate electrode, said SOI regions having a conductivity type the opposite of the conductivity type of said epitaxial layer; and
defining and forming bulk source and drain regions in portions of said second substrate on either side of at least one of said SOI source and drain regions, said bulk regions having a conductivity type opposite the conductivity type of said second substrate.

5. A method of fabricating a semiconductor structure as recited in claim 4, wherein said epitaxial layer and said second substrate have the same conductivity type.

6. A method of fabricating a CMOS semiconductor structure as recited in claim 5, wherein said epitaxial layer and said second substrate have opposite conductivity types.

7. A method of fabricating a semiconductor structure, comprising the steps of:
depositing an epitaxial semiconductor layer on a first semiconductor substrate of the opposite conductivity type from said epitaxial layer;
forming a silicon oxide layer of a predetermined thickness on a second semiconductor substrate;
bonding said second semiconductor substrate on said epitaxial layer of said first semiconductor substrate at a predetermined temperature in an oxidizing atmosphere using said silicon dioxide layer as the bonding material, thereby forming a bonded structure;
removing said first substrate from said bonded structure to expose a major surface of said epitaxial layer;
forming a masking layer on said epitaxial layer;
patterning said masking layer to cover preselected active device regions;
removing portions of said epitaxial layers exposed by said patterned masking layer;
removing said masking layer;
forming a gate oxide and gate electrode over a predetermined portion of said epitaxial layer;
defining and forming epitaxial source and drain regions of a conductivity type opposite to the conductivity type in said epitaxial layer; and
defining and forming source and drain regions in regions of said second semiconductor substrate adjacent and on either side of one of said epitaxial source and drain regions, said source and drain regions having a conductivity type opposite the conductivity type of said second substrate.

8. A method of forming a plurality of transistors having a shared element, comprising the steps of:
depositing an epitaxial semiconductor layer on a first side of a first semiconductor substrate;
bonding said first said of said first substrate to a first side of a second semiconductor substrate having a first insulating layer disposed on its first side to form a bonded structure;
removing said first semiconductor substrate from said bonded structure to expose a major surface of said epitaxial layer;
forming an insulating layer on a upper surface of said etched epitaxial layer;
etching selected portions of said epitaxial layer;
forming isolation regions on exposed portions of said second substrate;
forming a layer of conductive material on said isolation regions and said insulating layer;
etching said layer of conductive material, defining and forming first source and drain regions in portions of said epitaxial layer exposed by etching said layer of conductive material, said layer of conductive material forming a first gate electrode that cooperates with said first source and drain regions to form a first FET device; and
defining and forming second source and drain regions in portions of said second substrate on either side of a selected one of said first source and drain regions, said selected one of said first source and drain regions forming a second gate electrode that cooperates with said second source and drain regions to form a second FET device.

* * * * *